United States Patent
Shu et al.

(10) Patent No.: US 10,811,409 B2
(45) Date of Patent: Oct. 20, 2020

(54) METHOD OF MANUFACTURING FINFET WITH REDUCED PARASITIC CAPACITANCE AND FINFET STRUCTURE FORMED THEREBY

(71) Applicant: GLOBALFOUNDRIES INC., Grand Cayman (KY)

(72) Inventors: Jiehui Shu, Clifton Park, NY (US); Hui Zang, Guilderland, NY (US); Guowei Xu, Ballston Lake, NY (US); Jian Gao, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/161,620

(22) Filed: Oct. 16, 2018

(65) Prior Publication Data

US 2020/0119001 A1    Apr. 16, 2020

(51) Int. Cl.
| | |
|---|---|
| *H01L 27/088* | (2006.01) |
| *H01L 29/66* | (2006.01) |
| *H01L 21/762* | (2006.01) |
| *H01L 21/768* | (2006.01) |
| *H01L 21/8234* | (2006.01) |
| *H01L 29/49* | (2006.01) |

(Continued)

(52) U.S. Cl.
CPC ........ *H01L 27/0886* (2013.01); *H01L 21/762* (2013.01); *H01L 21/76832* (2013.01); *H01L 21/823418* (2013.01); *H01L 21/823431* (2013.01); *H01L 21/823475* (2013.01); *H01L 29/4966* (2013.01); *H01L 29/518* (2013.01); *H01L 29/66545* (2013.01); *H01L 29/66795* (2013.01); *H01L 29/7851* (2013.01)

(58) Field of Classification Search
CPC ............. H01L 27/0886; H01L 29/7851; H01L 29/518; H01L 29/66795; H01L 29/66545; H01L 29/4966
See application file for complete search history.

(56) References Cited

U.S. PATENT DOCUMENTS

| | | | |
|---|---|---|---|
| 7,615,426 B2 | 11/2009 | Wang et al. | |
| 9,324,713 B1 * | 4/2016 | Yu ..................... | H01L 21/31111 |

(Continued)

*Primary Examiner* — Kyoung Lee
*Assistant Examiner* — Christina A Sylvia
(74) *Attorney, Agent, or Firm* — Francois Pagette; Hoffman Warnick LLC

(57) ABSTRACT

Methods of manufacturing FinFETs including providing a precursor FinFET structure having a substrate with fins thereon, S/D junctions on fin tops, an STI layer on the substrate and between fins, a conformal first dielectric layer on the STI layer and S/D junctions, and a second dielectric layer on the first dielectric layer; forming a conformal third dielectric layer on the second dielectric layer and surfaces of the first dielectric layer located above the second dielectric layer; forming a fourth dielectric layer on the third dielectric layer such that third dielectric layer located between adjacent fins is exposed and such that third dielectric layer located above the adjacent fins is exposed; removing the exposed third dielectric layer and the first dielectric layer located thereunder, thereby exposing the S/D junctions; and forming a metal contact on the exposed S/D junctions and the exposed portion of the third dielectric layer between adjacent fins.

18 Claims, 11 Drawing Sheets

(51) Int. Cl.
*H01L 29/51* (2006.01)
*H01L 29/78* (2006.01)

(56) References Cited

U.S. PATENT DOCUMENTS

| | | | |
|---|---|---|---|
| 10,522,368 B2* | 12/2019 | Chao | H01L 29/66969 |
| 2008/0308873 A1 | 12/2008 | Chen et al. | |
| 2009/0289284 A1 | 11/2009 | Goh et al. | |
| 2010/0314690 A1 | 12/2010 | Chung et al. | |
| 2015/0179645 A1* | 6/2015 | Liao | H01L 29/41791 |
| | | | 257/77 |
| 2015/0340471 A1* | 11/2015 | Lim | H01L 29/0847 |
| | | | 438/283 |
| 2016/0365451 A1* | 12/2016 | Zang | H01L 29/66795 |

* cited by examiner

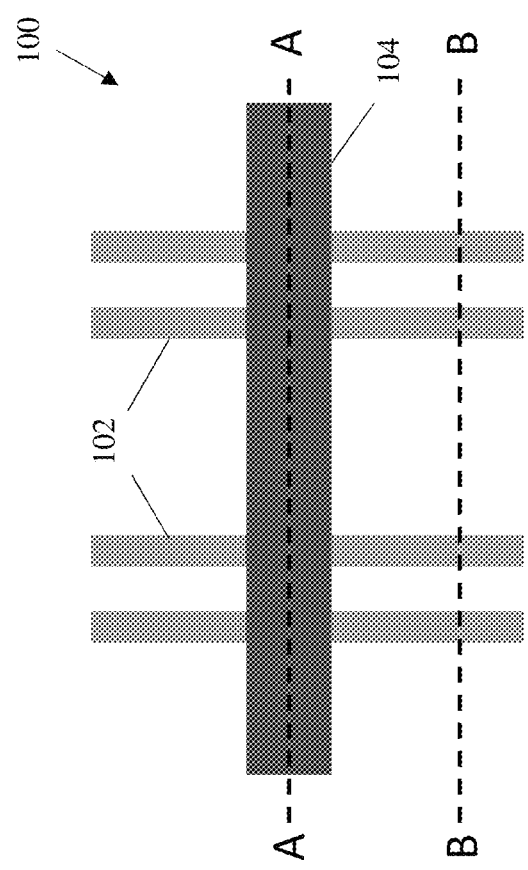

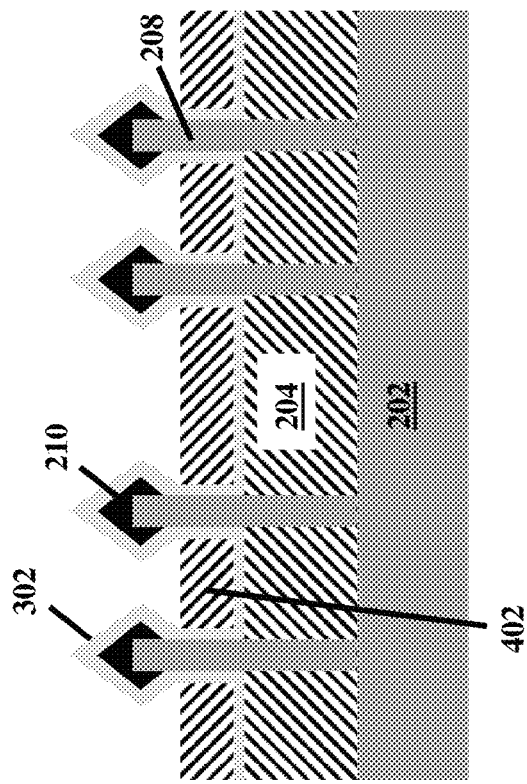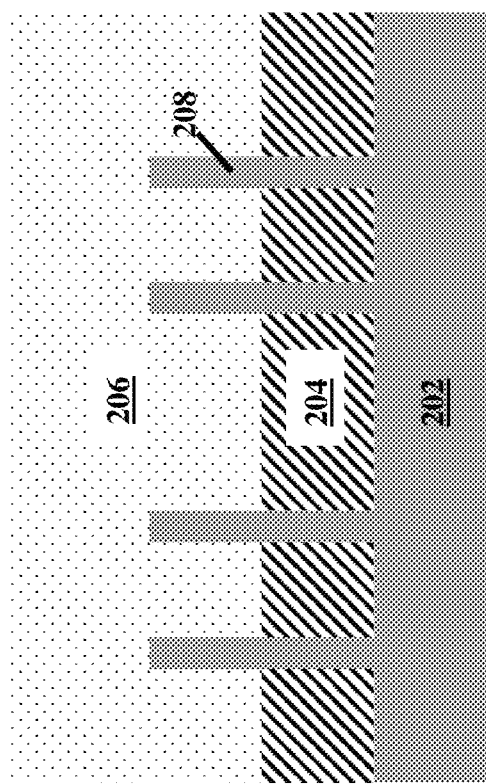

METHOD OF MANUFACTURING FINFET WITH REDUCED PARASITIC CAPACITANCE AND FINFET STRUCTURE FORMED THEREBY

TECHNICAL FIELD

The subject matter disclosed herein relates to methods of manufacturing FinFETs. More specifically, various aspects described herein relate to methods of manufacturing FinFETs with reduced contact-to-gate parasitic capacitance, and FinFET structures formed thereby.

BACKGROUND

As integrated circuits continue to scale downward in size, the FinFET is still an attractive device for use in semiconductor integrated circuits (ICs). With FinFETs, as with other transistor types, contacts that connect to the source, drain, and gate of the transistor and to other structure(s) are an important factor in the production of reliable integrated circuits with desired performance characteristics. However, in scaled down sizes such as 7 nm FinFETs and beyond, excessive recess depths of the trench silicide (TS) contact can generate excessive parasitic capacitance to a nearby gate which can significantly increase an IC's effective capacitance and degrade chip performance while providing no other device performance benefit.

BRIEF SUMMARY

Methods of manufacturing FinFETs with reduced contact-to-gate parasitic capacitance and FinFET structures formed thereby are disclosed. In a first aspect of the disclosure, a method of manufacturing a FinFET includes: providing a precursor FinFET structure including a substrate; at least two fins laterally spaced from one another on a top surface of the substrate; a source/drain epitaxial junction on a top surface of each fin; a shallow trench isolation (STI) layer on the top surface of the substrate and between adjacent fins; a first dielectric layer conformally formed on a top surface of the STI layer, sidewalls of the fins located above the top surface of the STI layer, and the source/drain epitaxial junctions; and a second dielectric layer on the first dielectric layer, the second dielectric layer having a top surface below the top surface of the fins; forming a conformal third dielectric layer on the top surface of the second dielectric layer and surfaces of the first dielectric layer located above the top surface of the second dielectric layer; forming a fourth dielectric layer on the third dielectric layer such that at least a portion of the third dielectric layer between at least two adjacent fins is exposed and such that the third dielectric layer above the at least two adjacent fins is exposed; removing the exposed third dielectric layer and removing portions of the first dielectric layer located thereunder, thereby exposing the source/drain epitaxial junctions of the at least two adjacent fins and exposing a portion of the second dielectric layer between the at least two adjacent fins; and forming a metal contact on the exposed source/drain epitaxial junctions of the at least two adjacent fins and the exposed portion of the second dielectric layer between the at least two adjacent fins.

In a second aspect of the disclosure, a method of manufacturing a FinFET includes: providing a precursor FinFET structure including a substrate, at least two fins laterally spaced from one another on a top surface of the substrate, a source/drain epitaxial junction on a first portion of a top surface of each fin, a shallow trench isolation (STI) layer on the top surface of the substrate and between adjacent fins, the STI layer having a top surface below the top surface of the fins, and at least one sacrificial gate perpendicular to the fins and disposed on and around a second portion of the top surface of the fins; forming a conformal first dielectric layer on the top surface of the STI layer, exposed sidewalls of the fins and exposed surfaces of the source/drain epitaxial junctions; forming a second dielectric layer on the first dielectric layer, the second dielectric layer having a top surface below the top surface of the fins, thereby leaving exposed surfaces of the first dielectric layer located above the top surface of the second dielectric layer; forming a conformal third dielectric layer on the top surface of the second dielectric layer and the exposed surfaces of the first dielectric layer; forming a fourth dielectric layer over the third dielectric layer; replacing the sacrificial gate with a metal gate having a cap thereover; selectively removing at least a portion of the fourth dielectric layer such that at least a portion of the third dielectric layer between at least two adjacent fins is exposed and such that the third dielectric layer above the at least two adjacent fins is exposed; removing the exposed third dielectric layer and removing the first dielectric layer located thereunder, thereby exposing the source/drain epitaxial junctions of the at least two adjacent fins and exposing a portion of the second dielectric layer between the at least two adjacent fins; and forming a metal contact on the exposed source/drain epitaxial junctions of the at least two adjacent fins and the exposed portion of the second dielectric layer between the at least two adjacent fins.

In a third aspect of the disclosure, a FinFET structure includes: a source/drain epitaxial junction on a top surface of each of adjacent fins laterally spaced from one another on a substrate; a pair of dielectric layers on an upper portion of sidewalls of the adjacent fins and on a lower portion of the source/drain epitaxial junctions on the adjacent fins; a metal contact contacting an upper portion of the source/drain epitaxial junctions on the adjacent fins and contacting an upper surface of an additional dielectric layer extending between a middle portion of the sidewalls of the adjacent fins; and a metal gate perpendicular to the adjacent fins and disposed on a top portion of the adjacent fins not covered by the metal contact.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 1 shows a typical top-down view of a multiple-fin and gate arrangement of a FinFET wherein an "A" cross-section and a "B" cross-section are shown for reference purposes for the remaining figures. Each of the remaining figures (FIGS. 2A, 2B through FIG. 11A, 11B) includes cross-section A as the "A" figure and cross-section B as the "B" figure for ease of comprehension of the overall three-dimensional structure resulting from the processes described herein.

FIGS. 5A, 5B show recessing of the second dielectric layer.

Figure 2B:
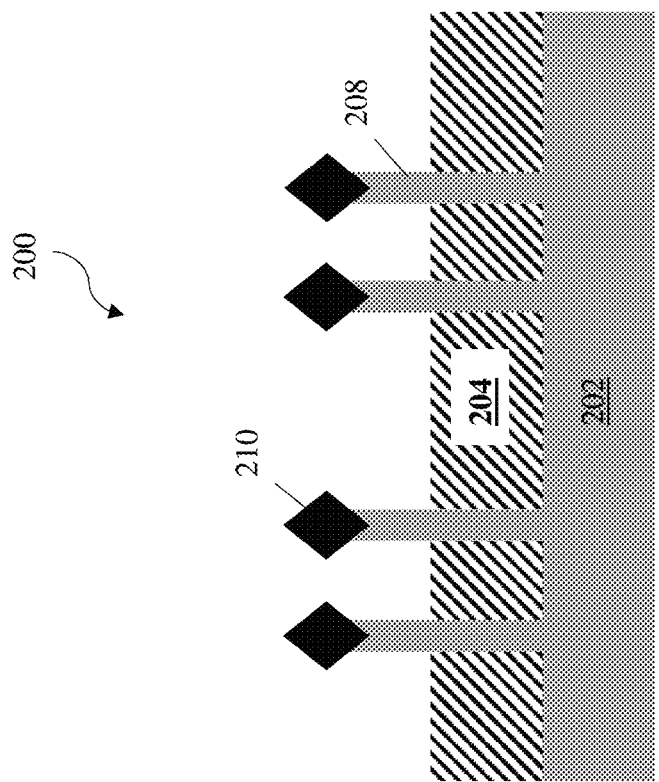
FIGS. 2A, 2B show a starting precursor FinFET structure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The subject matter disclosed herein relates to methods of manufacturing FinFETs. More specifically, various aspects described herein relate to methods of manufacturing FinFETs with reduced contact-to-gate parasitic capacitance, and FinFET structures formed thereby.

As noted above, in conventional scaled down FinFETs (such as 7 nm and beyond), excessive recess depths of the trench silicide (TS) contact can generate excessive parasitic capacitance to a nearby gate which can significantly increase an IC's effective capacitance and degrade chip performance while providing no other device performance benefit. In contrast to convention, various aspects of the disclosure include methods of manufacturing FinFETs which prevent excessive depth of the TS contact and thereby reduce contact-to-gate parasitic capacitance. In other aspects of the disclosure, FinFET devices are formed that allow for reduced contact-to-gate parasitic capacitance which in turn allows for reduced effective capacitance of an IC and improved device performance.

FIG. 1 depicts a top-down view of a multiple-fin and gate arrangement of a FinFET wherein an "A" cross-section and a "B" cross-section are shown for reference purposes for the remaining FIGS. 2A, 2B through 11A, 11B. The partial reference structure of FIG. 1 includes fins 102 and gate structure 104, both of which will be described in greater detail below.

With continued reference to cross-section A ("A" figures) and cross-section B ("B" figures) as shown in FIG. 1, a step-by-step depiction of producing an embodiment of the disclosure is illustrated in FIGS. 2A, 2B through FIGS. 11A, 11B. As noted above, cross-sections A and B in each of the A and B Figures, respectively, is shown for ease of comprehension of the overall resulting structure.

Figure 2A:
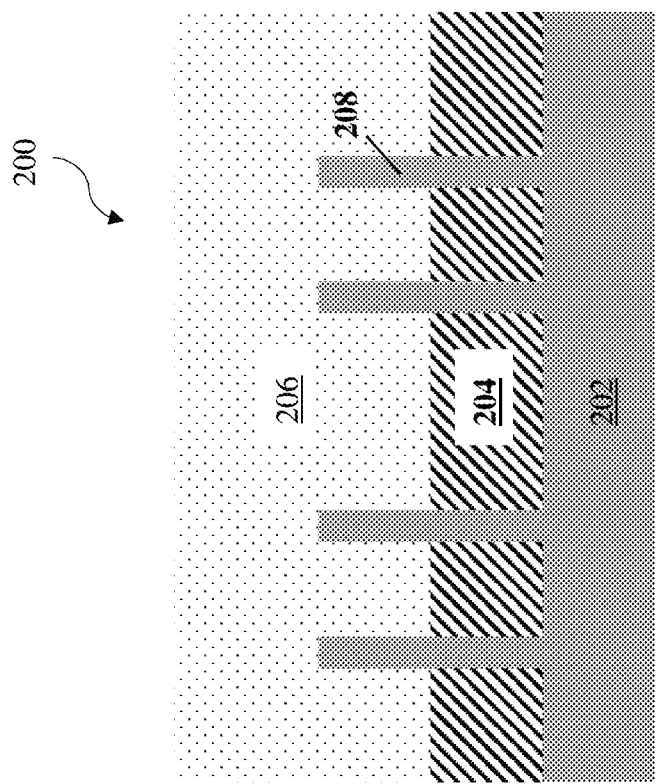

FIGS. 2A, 2B depict a starting precursor FinFET structure 200 that may be formed by any now known or later developed manufacturing techniques. The precursor structure includes a substrate 202. Substrate 202 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Precursor structure 200 may, for example, also include fins 208 positioned on substrate 202 and laterally spaced from one another. Although four fins are shown, precursor structure 200 may include any desirable number of fins for a semiconductor structure. Fins 208 may be formed by any now known or later developed semiconductor fabrication techniques for forming a fin on a substrate. For example, as shown in FIGS. 2A, 2B, fins 208 may be formed by patterned epitaxial growth of substrate 202 and/or patterned etchings of substrate 202 using a patterned mask (not shown). "Epitaxy" or "epitaxial growth," as used herein, refers to a process by which a thin layer of single-crystal or large-grain polycrystalline material is deposited on a base material with similar crystalline properties. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Precursor structure 200 may include, for example, a shallow trench isolation (STI) layer 204 formed on substrate 202 adjacent to fins 208. As shown in FIGS. 2A, 2B, STI layer 204 may be formed on a bottom portion of the sidewalls of fins 208. STI layer 204 may, for example, electrically isolate fins 208 from one another and other semiconductor structures on substrate 202. STI layer 204 may be formed on substrate 202 adjacent to fins 208 by conventional semiconductor fabrication techniques for forming an STI dielectric layer. For example, after the formation of fins 208 on substrate 202, STI layer 204 may be formed by deposition, chemical mechanical planarization (CMP) and etching. As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation. STI layer 204 may include but is not limited to: silicon monoxide (SiO), silicon dioxide (SiO2), and/or any another now known or later developed oxide materials.

After etching STI layer 204, an upper portion of fins 208, i.e., an active region of fins 208, may be re-exposed since STI layer 204 has a top surface below a top surface of the fins after etching. Source/drain epitaxial junctions 210 may be formed in the exposed upper portions of fins 208 (B cross-section only, FIG. 2B). For example, source/drain epitaxial junctions 210 may be formed by epitaxial growth and/or any other now known or later developed semiconductor fabrication techniques for forming a source/drain region on a fin. Source/drain epitaxial junctions 210 may include, for example, a p-doped region and/or an n-doped region. N-type dopants may include but are not limited to: phosphorous (P), arsenic (As), antimony (Sb). P-type dopants may include but are not limited to: boron (B), indium (In) and gallium (Ga).

As shown in the A cross-sectional view of FIG. 2A, after forming STI layer 204, a sacrificial gate structure 206 may be formed on STI layer 204 and on and perpendicular to upper portions of fins 208. Sacrificial gate structure 206 may be formed by conventional semiconductor fabrication techniques for forming a sacrificial gate structure, e.g., depositing an amorphous silicon in an opening in a dielectric layer over fins 208.

Figure 3B:
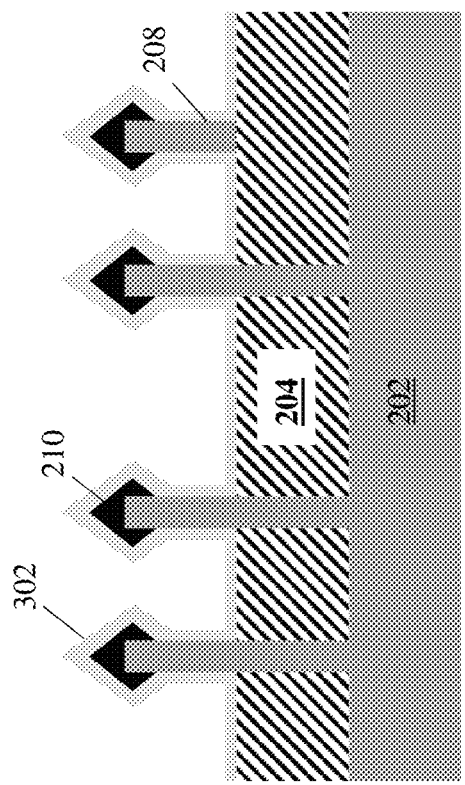
FIGS. 3A, 3B show formation of a conformal first dielectric layer.
Figure 3A:
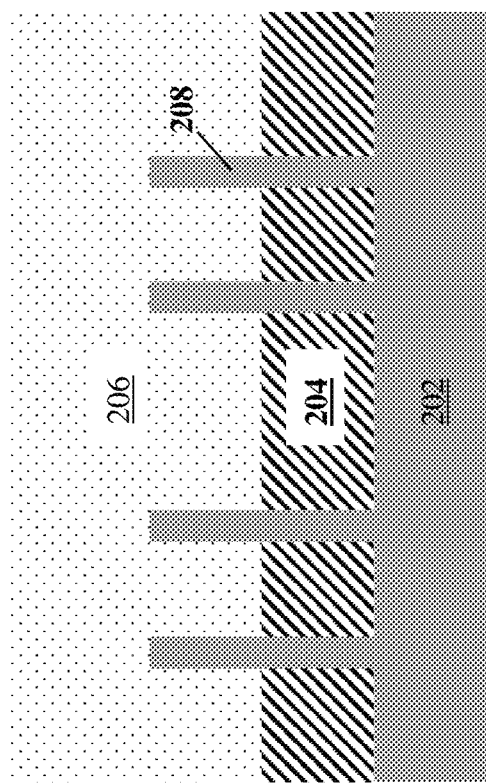

FIGS. 3A, 3B show forming a conformal first dielectric layer 302 over STI layer 204 and source/drain epitaxial junctions 210 and on exposed sidewalls of fins 208. First dielectric layer 302 may, for example, protect the source/drain epitaxial junctions 210 and fins 208 from damage such as oxidation from an oxide (e.g., $SiO_2$). First dielectric layer 302 may be formed over STI layer 204 and source/drain epitaxial junctions 210, for example, by deposition and/or any other now known or later developed semiconductor fabrication technique for forming a dielectric layer. First dielectric layer 302 may include but is not limited to: silicon mononitride (SiN), silicon carbonitride (SiNC), silicon carboxynitride (SiNOC), organoborosilazane (SiBCN), silicon nitride ($Si_3N_4$), silicon carboxide (SiCO) and silicon dioxide ($SiO_2$), or combinations thereof.

Figure 4B:
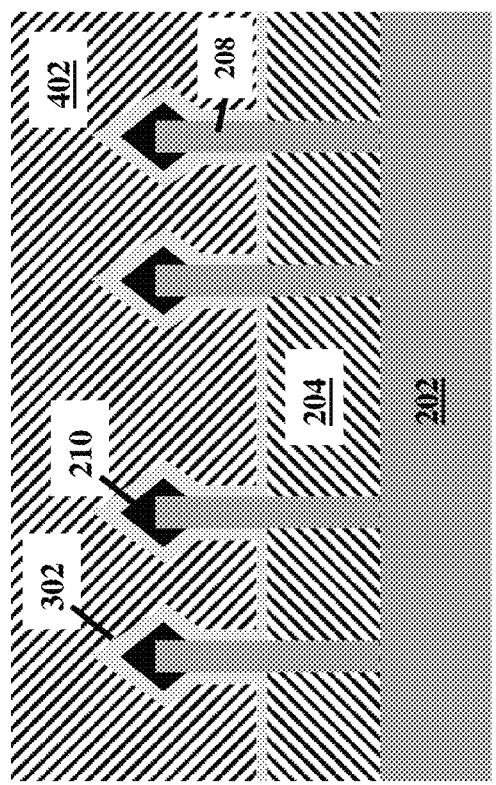
FIGS. 4A, 4B show formation of a second dielectric layer.
Figure 4A:
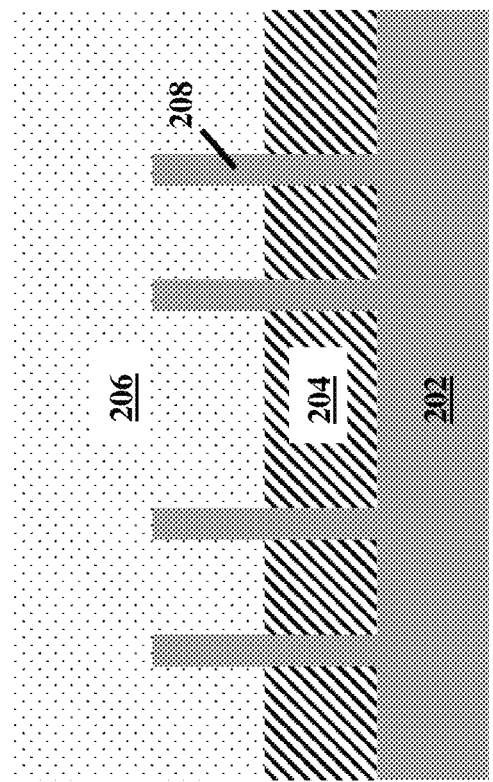

FIGS. 4A, 4B show forming a second dielectric layer 402 over first dielectric layer 302. Second dielectric layer 402 may, for example, electrically isolate semiconductor structures formed therein. Second dielectric layer 402 may be formed over first dielectric layer 302, for example, by deposition and chemical mechanical planarization (CMP), and/or any other now known or later developed semiconductor fabrication technique for forming a dielectric layer. Second dielectric layer 402 may include but is not limited to: silicon mononitride (SiN) and silicon dioxide ($SiO_2$), or combinations thereof.

FIGS. 5A, 5B show recessing second dielectric layer 402 such that recessed dielectric layer 402 has a top surface below the top surface of the fins, thereby leaving exposed surfaces of first dielectric layer 302 located above the top surface of second dielectric layer 402 (see diamond shaped portions of exposed first dielectric layer 302 in FIG. 5B). Recessing second dielectric layer 402 may be performed, for example, by etching, and/or any other now known or later developed etching technique for selectively etching a dielectric layer.

Figure 6B:
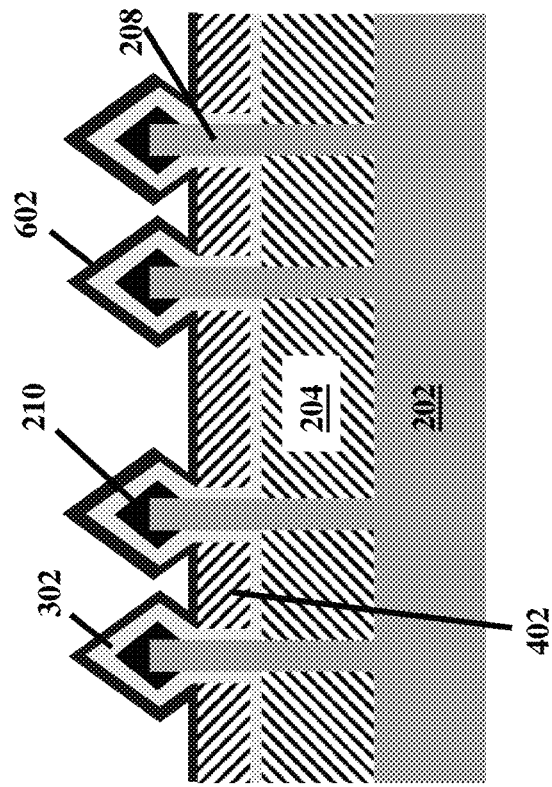
FIGS. 6A, 6B show formation of a conformal third dielectric layer.
Figure 6A:
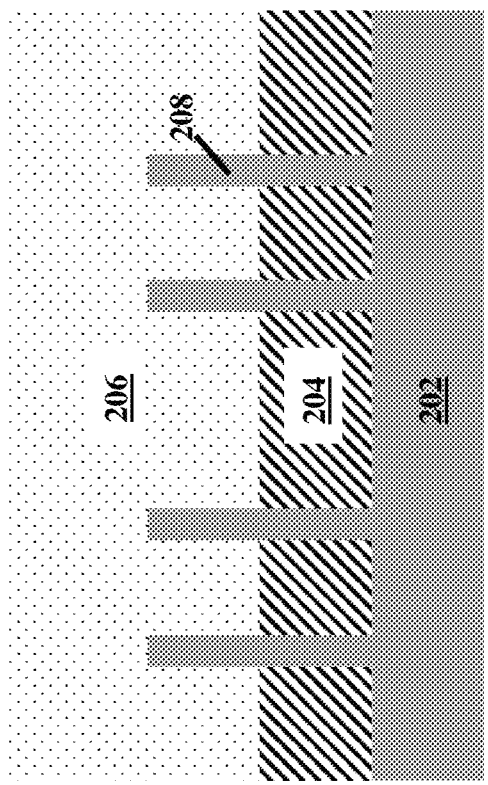

FIGS. 6A, 6B show forming a conformal third dielectric layer 602 over second dielectric layer 402 and exposed surfaces of first dielectric layer 302. Third dielectric layer 602 may, for example, act as a liner and an etch stop during subsequent processing steps discussed below. Accordingly, the location of third dielectric layer 602 acting as an etch stop should be selected to provide a contact (discussed below with respect to FIGS. 11A, 11B) with reduced depth allowing for reduced contact-to-gate parasitic capacitance as mentioned above. Third dielectric layer 602 may be conformally formed over second dielectric layer 402 and exposed surfaces of first dielectric layer 302, for example, by deposition and/or any other now known or later developed semiconductor fabrication technique for forming a conformal dielectric layer. The material of third dielectric layer 602 may include, but is not limited to: silicon mononitride (SiN), aluminum oxide ($Al_2O_3$), aluminum nitride (AlN) and hafnium dioxide ($HfO_2$; also known as hafnium(IV) oxide), or combinations thereof. The material of third dielectric layer 602 should be selected for high etch selectivity purposes such that no punch through during subsequent etching occurs (discussed below with respect to FIGS. 9A, 9B and 10A, 10B).

Figure 7B:
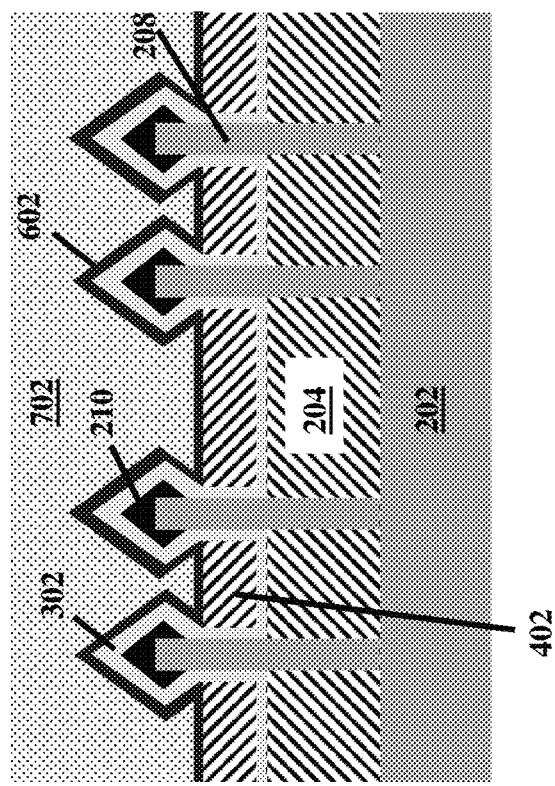
FIGS. 7A, 7B show formation of a fourth dielectric layer.
Figure 7A:
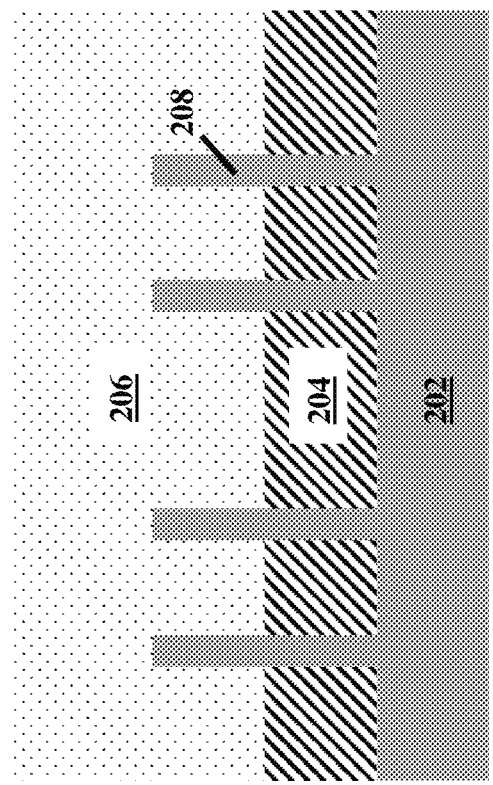

FIGS. 7A, 7B show forming a fourth dielectric layer 702 over third dielectric layer 602. Fourth dielectric layer 702 may, for example, electrically isolate semiconductor structures formed therein and protect the structures from subsequent replacement metal gate (RMG) processing steps (discussed below with respect to FIGS. 8A, 8B). Fourth dielectric layer 702 may be formed over third dielectric layer 602, for example, by deposition and chemical mechanical planarization (CMP), and/or any other now known or later developed semiconductor fabrication technique for forming a dielectric layer. Fourth dielectric layer 702 may include but is not limited to: silicon mononitride (SiN) and silicon dioxide ($SiO_2$), or combinations thereof.

Figure 8B:
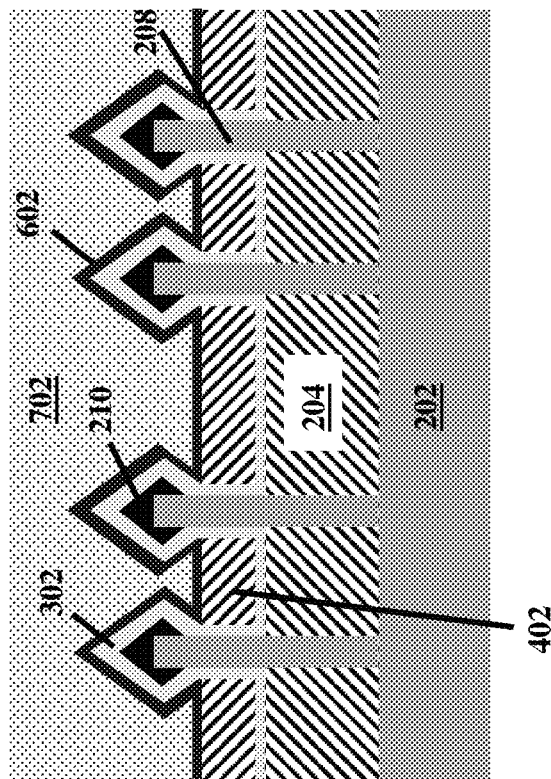
FIGS. 8A, 8B show the result of a replacement metal gate (RMG) process.
Figure 8A:
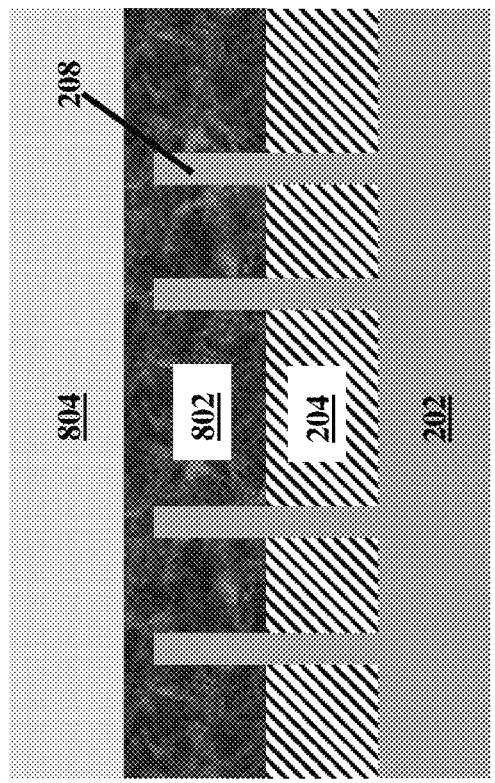

FIGS. 8A, 8B show replacing sacrificial gate structure 206 with a metal gate 802 having a cap 804 thereover. More specifically, FIG. 8A depicts the result of forming metal gate 802, for instance by removing sacrificial gate structure 206 and depositing metal gate 802 material over STI layer 204 such that a top surface of metal gate 802 is above tops of fins 208. Metal gate 802 can comprise various films and can be different for different types of devices (e.g., NFET, PFET, etc.). The material of metal gate 802 can be, for example, any suitable high-k dielectric material, for example, $HfO_2$ and $ZrO_2$. The metal gate 802 can comprise a work function metal such as TiN, TiC, TiAl, TaN, etc. and can further comprise one or more low resistance conducting metals such as W, Co and Ru. FIG. 8A also depicts the formation of cap 804 over metal gate 802. Cap 804 can be deposited and may be comprised of, for example, SiBCN, SiNC, SiN, $Si_3N_4$, SiCO, $SiO_2$ or SiNOC.

Figure 9B:
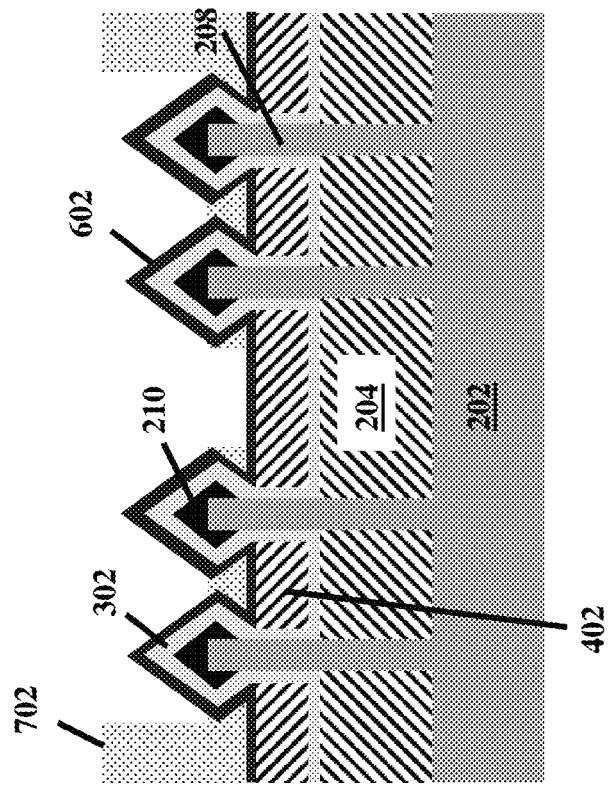
FIGS. 9A, 9B show selective removal of a portion of the fourth dielectric layer.
Figure 9A:
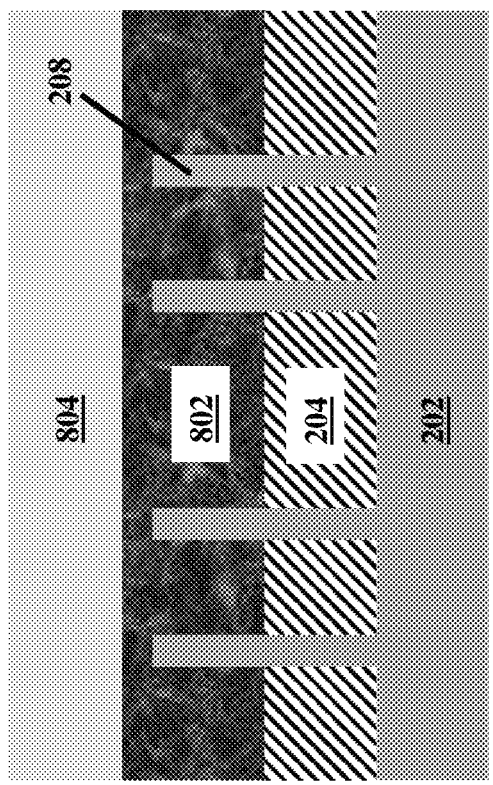

FIGS. 9A, 9B show removing a portion of fourth dielectric layer 702, for example, with RIE with a high etch selectivity such that no punch through of third dielectric layer 602 occurs. In other words, the RIE as shown in FIG. 9B stops at the third dielectric layer 602 such that at least a portion of third dielectric layer 602 between at least two adjacent fins 208 is exposed and such that third dielectric layer 602 located above the at least two adjacent fins 208 is also exposed. As noted above, use of third dielectric layer 602 as an etch stop provides a contact (discussed below with respect to FIGS. 11A, 11B) with reduced depth allowing for reduced contact-to-gate parasitic capacitance. Any necessary mask (not shown) may be employed to direct the etching.

Figure 10B:
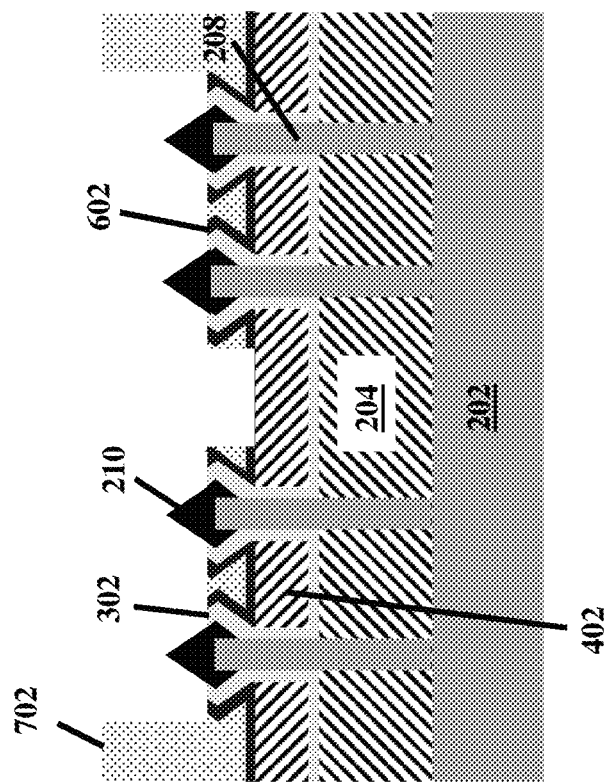
FIGS. 10A, 10B show removal of exposed third dielectric layer and first dielectric layer thereunder.
Figure 10A:
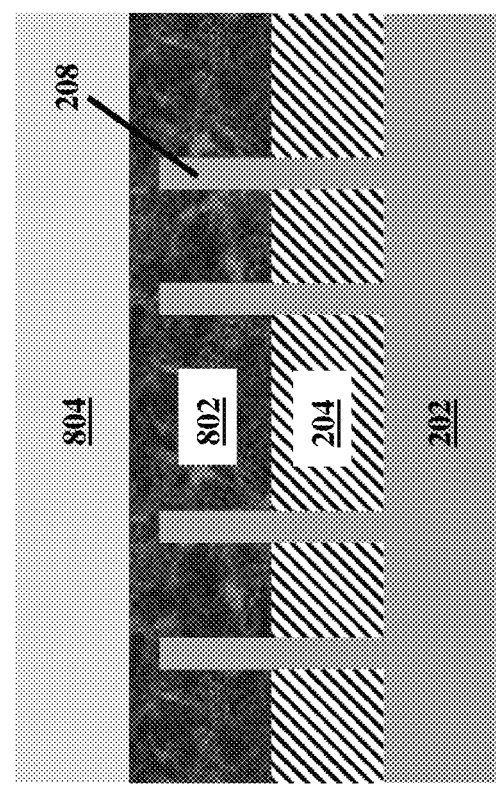

FIGS. 10A, 10B show the removal of the exposed portions of third dielectric layer 602 (FIG. 9B) as well as the removal of portions of first dielectric layer 302 located under the removed (exposed) third dielectric layer 602 (FIG. 9B). As can be seen in FIG. 10B, the noted removal exposes the source/drain epitaxial junctions 210 of fins 208, allowing for subsequent contact formation thereon. The noted removal can be accomplished via etching, for example by a dry etch or a wet etch. To reduce potential damage to source/drain epitaxial junctions 210, a wet etch may be preferred. Additionally, during wet etching, it can be difficult to etch material in small/tight spaces. Thus, like shown in FIG. 10B, only the broadly exposed portions of third dielectric layer 602 (FIG. 9B) are removed while portions of third dielectric layer 602 located in small/tight spaces are maintained.

Figure 11B:
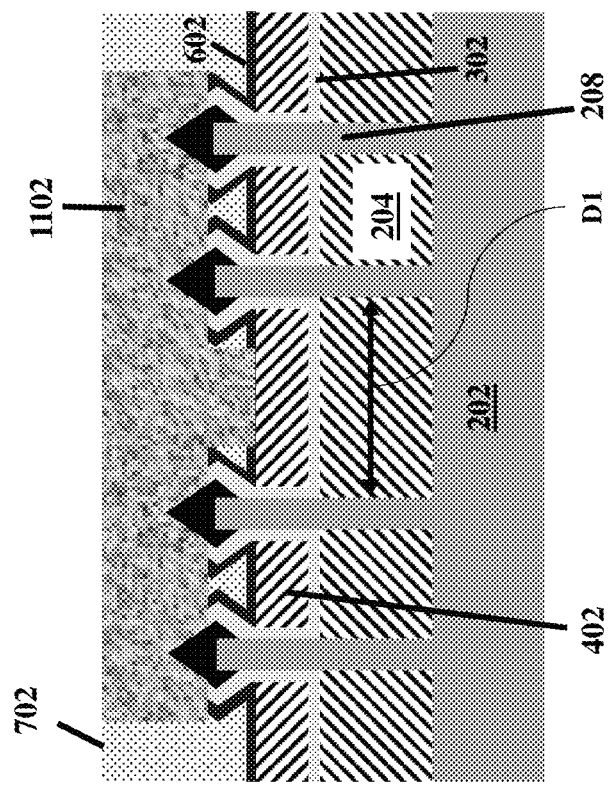
FIGS. 11A, 11B show formation of a metal contact.
Figure 11A:
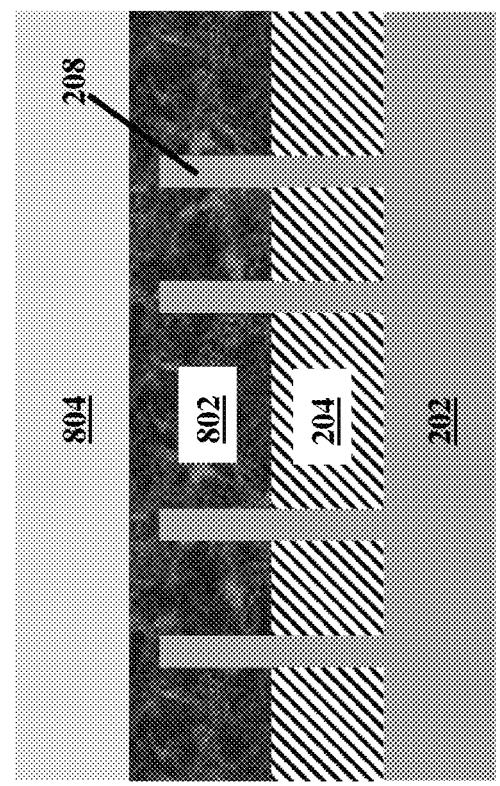

FIGS. 11A, 11B show forming a metal contact 1102 on exposed source/drain epitaxial junctions 210 (FIG. 10B). Metal contact 1102 can be, for example, a trench silicide (TS) region or a via. Metal contact 1102 may be composed of any conductive metal suitable for a transistor metal contact, for example, W, Co and Ru, perhaps with a refractory metal line (not shown). As shown in FIG. 11B, metal contact 1102 has a depth that ceases at second dielectric layer 402 located between at least two adjacent fins 208. Such a reduced depth of contact 1102 (sometimes referred to as a thickness of the contact) allows for a FinFET that has a contact-to-gate parasitic capacitance that is reduced compared to a FinFET device produced without the use/inclusion of third dielectric layer 602. This is especially so in situations where a distance D1 between two adjacent fins 208 under metal contact 1102 is at least 10 nanometers (nm) and the reduced depth/thickness of the contact is located within the at least 10 nm distance D1. Thus, even for FinFETs having a 10 nm or more fin separation, reduced contact-to-gate parasitic capacitance can be attained by the methods of the disclosure which in turn reduces an IC's effective capacitance and increases device performance.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A FinFET structure comprising:
a source/drain epitaxial junction on a top surface of each of adjacent fins laterally spaced from one another on a substrate;

a pair of dielectric layers on an upper portion of sidewalls of the adjacent fins and on a lower portion of the source/drain epitaxial junctions on the adjacent fins, wherein one of the pair of dielectric layers extends below the upper portion of the sidewalls of the adjacent fins and is located on a middle portion of the sidewalls of the adjacent fins and extends between the middle portion of the sidewalls of the adjacent fins; and wherein an additional dielectric layer that extends between the middle portion of the sidewalls of the adjacent fins is located on a portion of the one of the pair of dielectric layers that extends between the middle portion of the sidewalls of the adjacent fins;

a metal contact contacting an upper portion of the source/drain epitaxial junctions on the adjacent fins and contacting an upper surface of the additional dielectric layer extending between a middle portion of the sidewalls of the adjacent fins; and a metal gate perpendicular to the adjacent fins and disposed on a top portion of the adjacent fins not covered by the metal contact.

2. The FinFET structure of claim 1, further comprising a shallow trench isolation (STI) layer extending between a lower portion of the sidewalls of the adjacent fins, the STI layer being located above the substrate and below the portion of the one of the pair of dielectric layers that extends between the middle portion of the sidewalls of the adjacent fins.

3. The FinFET structure of claim 2, wherein
an other one of the pair of dielectric layers extends between the upper portion of the sidewalls of the adjacent fins, with the exception of where the metal contact contacts the upper surface of the additional dielectric layer that extends between the middle portion of the sidewalls of the adjacent fins; and
wherein a fourth dielectric layer is located on the other one of the pair of dielectric layers.

4. The FinFET structure of claim 1, wherein the FinFET has a contact-to-gate parasitic capacitance that is reduced compared to a FinFET not including the metal contact that contacts an upper surface of the additional dielectric layer that extends between the middle portion of the sidewalls of the adjacent fins.

5. The FinFET structure of claim 1, wherein the metal contact is a via.

6. The FinFET structure of claim 1, wherein the metal contact comprises W, Co or Ru.

7. The FinFET structure of claim 1, wherein a distance between the adjacent fins is at least 10 nanometers.

8. The FinFET structure of claim 1, wherein the metal gate is selected from the group consisting of: $HfO_2$, $ZrO_2$TiN, TiC, TiAl, TaN W, Co and Ru.

9. The FinFET structure of claim 1, wherein the source/drain epitaxial junctions comprise a p-doped region and/or an n-doped region.

10. A method of manufacturing a FinFET, comprising:
providing a precursor FinFET structure including a substrate; at least two fins laterally spaced from one another on a top surface of the substrate; a source/drain epitaxial junction on a top surface of each fin; a shallow trench isolation (STI) layer on the top surface of the substrate and between adjacent fins; a first dielectric layer conformally formed on a top surface of the STI layer and sidewalls of the fins located above the top surface of the STI layer and the source/drain epitaxial junctions forming a conformal second dielectric layer over the first dielectric layer;

removing a portion of second dielectric layer such that the second dielectric layer has a top surface below the top surface of the fins and exposing portion of the first dielectric layer;

forming a conformal third dielectric layer over the second dielectric layer and exposed surfaces of the first dielectric layer;

forming a fourth dielectric layer over third dielectric layer;

removing a portion of fourth dielectric layer such that at least a portion of third dielectric layer between the at least two laterally spaced fins is exposed and such that third dielectric layer located above the at least two laterally spaced fins is also exposed; and forming a metal contact on the exposed source/drain epitaxial junctions of the at least two adjacent fins and the exposed portion of the second dielectric layer between the at least two adjacent fins.

11. The method of claim 10, wherein the providing of the precursor FinFET structure includes:

forming the conformal first dielectric layer on the top surface of the STI layer, exposed sidewalls of the fins and exposed surfaces of the source/drain epitaxial junctions, the top surface of the STI layer being below the top surface of the fins.

12. The method of claim 11, wherein the providing of the precursor FinFET structure further includes:

forming the second dielectric layer on the first dielectric layer such that a top surface of the second dielectric layer is above the top surface of the fins.

13. The method of claim 10, wherein the precursor FinFET structure further includes at least one sacrificial gate perpendicular to the fins and disposed on and around a portion of the top surface of the fins.

14. The method of claim 13, wherein the forming of the fourth dielectric layer includes:

forming the fourth dielectric layer on the third dielectric layer, replacing the at least one sacrificial gate with a metal gate having a cap thereover, and selectively removing at least a portion of the fourth dielectric layer such that at least a portion of the third dielectric layer located between at least two adjacent fins is exposed and such that the third dielectric layer located above the at least two adjacent fins is exposed.

15. The method of claim 10, wherein a distance between two adjacent fins under the metal contact is at least 10 nanometers (nm).

16. The method of claim 15, wherein a thickness of a portion of the metal contact located within the at least 10 nm distance is reduced compared to a FinFET not including the third dielectric layer.

17. The method of claim 10, wherein the FinFET has a contact-to-gate parasitic capacitance that is reduced compared to a FinFET not including the third dielectric layer.

18. The method of claim 10, wherein the first dielectric layer comprises one or more of SiN, SiNC, SiNOC, SiBCN, $Si_3N_4$, SiCO and $SiO_2$.

* * * * *